United States Patent [19]

Sato et al.

[11] 3,882,395

[45] May 6, 1975

[54] SOLID STATE VHF AMPLIFIER CIRCUIT FOR ELIMINATING INTERFERENCE CAUSED BY NONLINEARITY OF A TRANSISTOR

[75] Inventors: Masashi Sato; Koji Tanaka; Masaaki Miura, all of Gunma, Japan

[73] Assignees: Sanyo Electric Company, Ltd., Osaka; Tokyo Sanyo Electric Company, Ltd., Gunma, both of Japan

[22] Filed: Dec. 7, 1972

[21] Appl. No.: 312,917

[30] Foreign Application Priority Data

Dec. 7, 1971 Japan .............................. 46-100551

[52] U.S. Cl. ................ 325/319; 325/381; 325/383; 325/387; 325/479; 330/31; 330/177

[51] Int. Cl. .......................... H04b 1/12; H04b 1/14

[58] Field of Search.... 325/318, 319, 365, 373-381, 325/383-385, 388, 387, 473, 477, 479, 488, 489; 330/31, 149, 177, 186, 187

[56] References Cited

UNITED STATES PATENTS 3,571,719 3/1971 Beary et al.......................... 325/380

*Primary Examiner*—Robert L. Griffin
*Assistant Examiner*—Marc E. Bookbinder
*Attorney, Agent, or Firm*—Armstrong, Nikaido & Wegner

[57] ABSTRACT

An improvement of a solid sate VHF (Very High Frequency) input circuit for eliminating the interference caused by the nonlinearity of a transistor. Between the first tuning stage and a terminal of a transistor, operating as a VHF amplifier, is inserted a condenser, the capacitance of which is calculated by considering the nonlinear characteristic of the transistor in the VHF region and the input signal level in the strong electric field of broadcast for eliminating detuning of the tuning frequency and preventing the reduction of the quality factor which together cause at least three new types of interference troubles.

3 Claims, 8 Drawing Figures

SOLID STATE VHF AMPLIFIER CIRCUIT FOR ELIMINATING INTERFERENCE CAUSED BY NONLINEARITY OF A TRANSISTOR

BACKGROUND OF THE INVENTION

This invention relates to VHF input circuits and more particularly to solid state VHF input circuits for eliminating the interference caused by nonlinear characteristics of transistors.

The increasing use of VHF bands in TV broadcasting has detrimentally affected TV reception by vitue of interaction between channels. Reception has been further adversely affected by numerous other complicated interactions and disturbances possibly caused by the high density of high powered FM stations around urban communities causing so-called "beating" between FM air signals and/or TV air signals. It is well known that these interactions and disturbances are technically classified as image frequency interference, interference from adjacent channels and cross-modulation.

However, up to the present time the prior art does not appear to place much emphasis on other types of interferences resulting from the nonlineality of the automatic-gain controlled VHF amplifier including a transistor of the bipolar-type (hereinafter just referred to as "transistor") under the strong field of broadcast. It has now apparently, for the first time, been discovered that the reason for almost all the interference troubles incurred in the latest TV receivers originates in interference caused by the non-linear characteristics of a transistor. These interferences can be termed second term high harmonic distortion, bisignal interference and oscillating interference.

Therefore, it is an object of the present invention to provide an improved solid state VHF amplifier circuit for eliminating or minimizing said last named interference troubles.

Similarly, it is an object of the present invention to provide an improved solid state VHF input circuit for eliminating or minimizing the interference from the second term high harmonic distortion.

Further, it is an object of the present invention to provide an improved solid state VHF input circuit for eliminating or minimizing both bisignal and oscillating interferences.

SUMMARY OF THE INVENTION

In a solid state VHF input circuit having a tuning stage including a tuning coil connected to an antenna terminal and a pair of condensers serially-connected through a common terminal and bridging said tuning coil, and a transistor having one of the terminals thereof connected to said common terminal to receive the output of said tuning stage, the improvement comprising a third condenser inserted between said common terminal and said one terminal of said transistor, the capacitance of said third condenser being selected to prevent detuning under the deep AGC and to prevent reduction of the quality factor of said tuning stage in case of reception in the strong field of broadcast thereby eliminating interference troubles caused by the nonlinear characteristics of said transistor.

BRIEF DESCRIPTION OF DRAWINGS

These and other objects, features and advantages of the present invention will become more readily apparent to those skilled in the art from the following detailed description when taken in conjunction with the drawings wherein.

DETAILED DESCRIPTION

Figure 1:
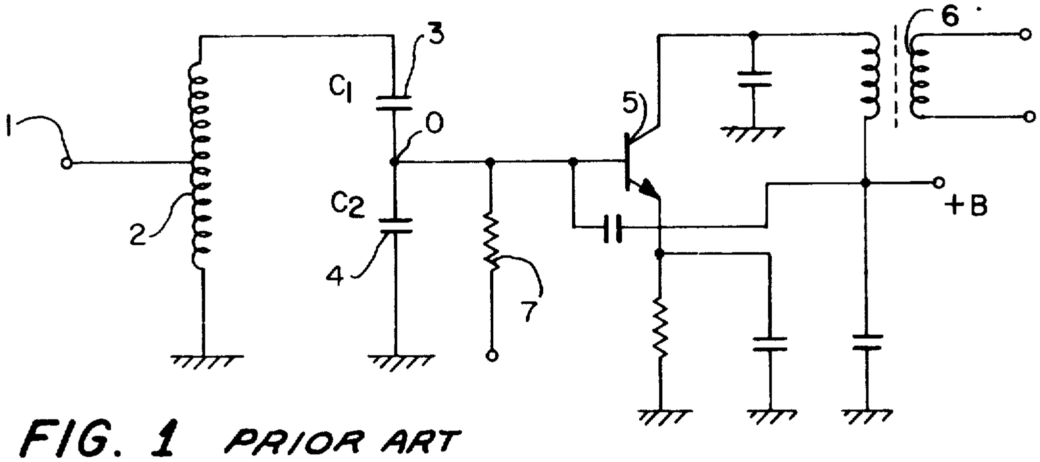
FIG. 1 PRIOR ART
FIG. 1 is a diagram of a prior art circuit.

Attention is now drawn to the fact, as briefly mentioned hereinabove, new types of interference troubles should be solved to achieve good reception of TV programs in the strong electric field of broadcast which covers urban communities. The reasons for these troubles have, for the first time, been discovered by the inventors herein and are as set forth below.

It is well known in a transistor that the relation between the instantaneous collector current $i_c$ and the instantaneous input voltage $v_{be}$ across the emitter and base is described by following equation especially in VHF region:

$$i_c = a_0 + a_1 v_{be} + a_2 v_{be}^2 + a_3 v_{be}^3 \quad (1)$$

wherein $a_0$, $a_1$, $a_2$ and $a_3$ are individually defined constants depending on the characteristics of the transistors. This means that a transistorized VHF amplifier has square and cube characteristics in addition to a proportional amplitude characteristic.

Assuming that a fairly strong VHF broadcasting signal of Y channel which consists of Picture carrier: $e_{Y_p} = E_{Y_p} \sin Y_p t$ and Sound carrier: $e_{Y_s} = E_{Y_s} \sin Y_s t$ is fed into an input terminal of a VHF amplifier forming a part of a tuning stage tuned for channel X, the latter consisting of Picture carrier: $e_{X_p} = E_{X_p} \sin X_p t$ Sound Carrier: $e_{X_s} = E_{X_s} \sin X_s t$ under the strongest field of broadcast.

Because of the aforementioned cube characteristic of a transistor included in a VHF amplifier, a new component signal, $$e_{o_2} = \frac{3}{2} a_3 E_{X_s} E_{Y_p} E_{Y_s} \sin \{X_s - (Y_s - Y_p)\} t \quad (2)$$

will be created in addition to desired amplified signals:

$$e_{o_1} = a_1 E_{X_p} \cdot \sin X_p t \quad (3)$$

$$e_{o_1} = a_1 E_{X_s} \cdot \sin X_s t \quad (4)$$

Since the difference between $Y_s$ and $Y_p$ is equal to the difference 4.5MHz, between sound carriers and picture carriers in general, it is clearly understood that frequency component of amplified desired signal $e_{o_1}$ coincides with that of $e_{o_2}$ described above, in other words $$X_p = X_s - (Y_s - Y_p)$$

then, $$X_s - X_p = Y_s - Y_p.$$

Since in equation (3) $e_{o_1}$ represents the picture carrier on channel X, amplitude-modulated by a picture signal, it can be rewritten as follows:

$$e_{o_1} = a_1 E_{Xp} (1 + m_a \cos pt) \cos X_p t \qquad (5)$$

wherein:

$m_a$ represents rate of amplitude modulation and $p$ represents angular frequency of modulating wave.

Since equation (2) contains sound components of both $X$ and $Y$ channels and frequency-modulated by a sound signal, it will be understood that the equation can be rewritten as follows:

$$e_{o_2} = \frac{3}{2} a_3 \cdot E_{X_s} \cdot E_{Y_p} \cdot E_{Y_s} \cos (X_p t + m_f \sin qt) \qquad (6)$$

wherein $m_f$ represents the rate of frequency-modulation and $q$ represents the angular frequency of the modulating wave. Then $$e_{o_1} + e_{o_2} = 2E_{Xp} (1 + m_a \sin pt) \cdot \cos \tfrac{1}{2} (m_f \sin qt) \cdot \cos (X_p t + \tfrac{1}{2} m_f \sin qt) \qquad (7)$$

which means that the picture component of channel $X$ will be disturbed in accordance with the term cos ½ ($m_f$ sin $qt$), being observable as random white lines on the picture tube.

This kind of interference trouble is named herein as "oscillating interference" because numerous lateral stripes are observable on the picture tube. This is very similar to the stripes resulting from a positive feedback happening when circuits are wired too closely.

Another interference trouble named "bisignal interference" is defined as one caused by the sum or difference between two interrupted signals particularly because of the square characteristic of the transistor. If the TV broadcasting signal is one of said interrupted signals, interference causes so-called "windwiping" from another interrupting TV signal. Now, substituting an arbitrary interfering signal, $e_u = E_{u_1} \sin \omega_u t$, for the third term of equation (1), $$i_{c_2} = \tfrac{1}{2} a_2 E_u^2 (1 - \cos 2 \omega_u t), \qquad (8)$$

This means the creation of uninvited bisignal interference. In other words, if the unpreferable air signal having one-half the frequency of that of the channel tuned in is fed into the antenna terminal, two multiplied undesired signals will be derived from the collector of the transistor in mixed form. It is clear that beat signal disturbance inevitably occurs between those two signals.

Turning now to the drawings, FIG. 1 illustrates a main part of a known VHF input circuit which forms a part of a VHF turning circuit. Numeral 1 refers to an input terminal, such as an antenna, coupled with tuning coil 2 which forms a first tuning circuit with a pair of condensers 3 and 4. The common point O of both condensers is connected directly to the base of transistor 5 specifically selected for the VHF amplifier. The collector of transistor 5 is loaded with a coupling transformer 6. Finally, numeral 7 designates a conventional AGC (automatic gain control) terminal.

Figure 7:
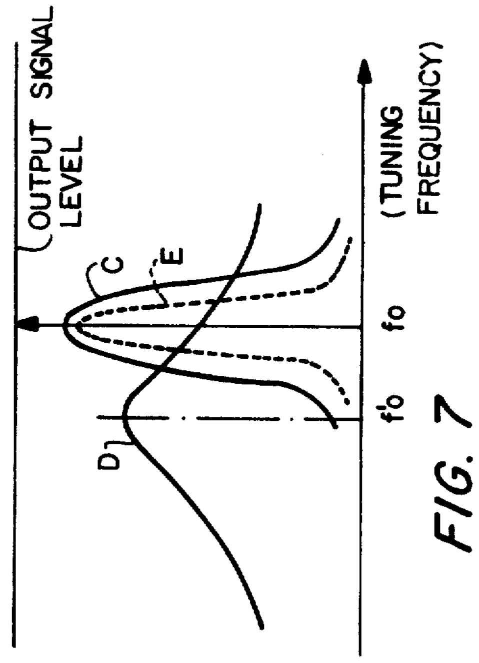
FIG. 7 is a chart of "Attenuation Ratio" versus "Frequency" experimentally resulting from the circuits of both the prior art and a preferred embodiment of the invention.

Referring now to FIG. 7, in which the tuning frequencies are plotted as the abscissa while the output levels of the first tuning circuit form the ordinate, response curve C is a sharp curve representing good reception without disturbance by interfering signals when a moderate AGC signal is applied to said AGC terminal 7 under the average strongest field of broadcast. To the contrary, response curve D, representing the prior art circuit of FIG. 1 under the strong field of broadcast, is not sharp enough to prevent interfering signals and to make matters worse, the tuning frequency $f_o$ is shifted positionally to $f_o'$, detuning the desired channel and which introduces the various interfering troubles mentioned above with a reduction of the quality factor. Curve E, the result of the invention, will be discussed hereinafter.

Figure 6:
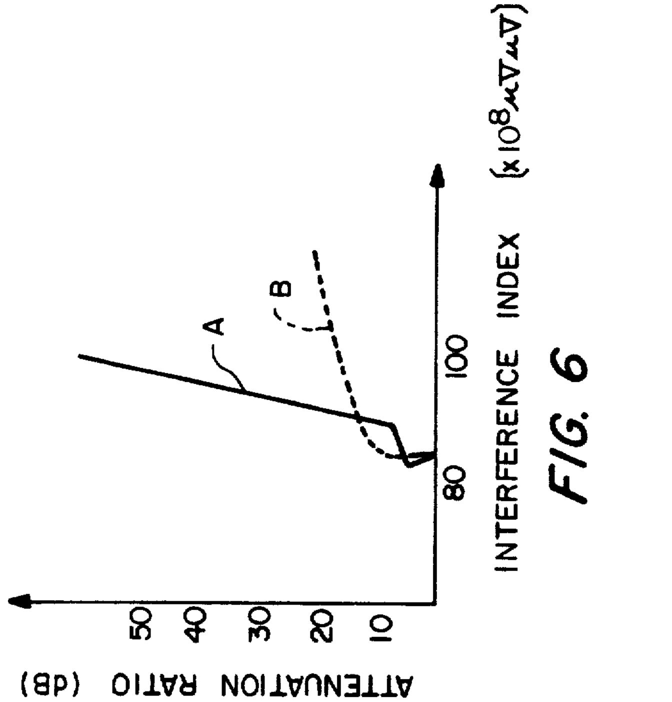
FIG. 6 represents a chart of "Attenuation Ratio" versus "Interference Index" comparing the experimental results of the circuits of both the prior art and a preferred embodiment of the invention.

FIG. 6 shows "Interference index" versus "Attenuation ratio" where the former, $I$, is defined as:

$$I = \frac{E_{X_s} \cdot E_{Y_p} \cdot E_{Y_s}}{E_{Xp}} \qquad (9)$$

Figure 2:
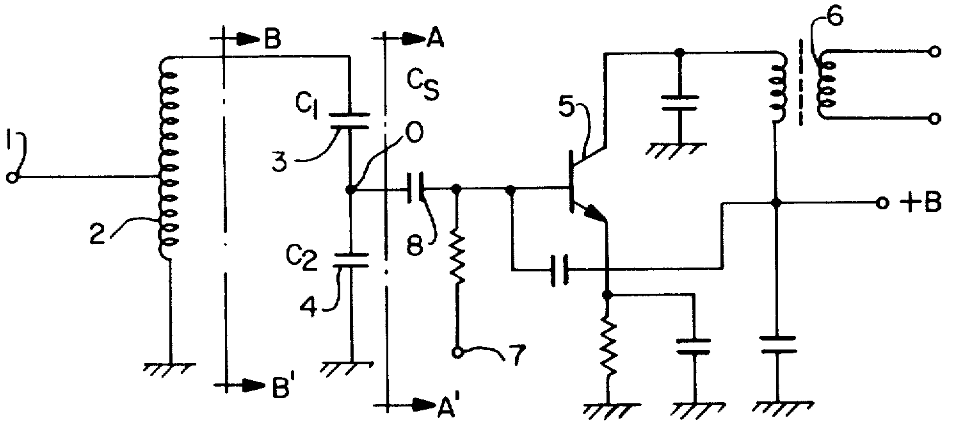
FIG. 2 discloses a diagram of a circuit according to an embodiment of the invention.

In this figure, curve A shows the characteristics of the prior art circuit of FIG. 1. Curve B as will be described represents the present invention. Having observed the details and defects of the prior, attention may now be given to the present invention, an embodiment of which is shown in FIG. 2.

The basic purposes of the present invention can be summarized as follows:

1. To make the quality factor Q of the first tuning circuit under deepest AGC in the strongest field of broadcast higher than that under shallowest AGC when the gain of VHF amplifier is maintained at a maximum.

2. To minimize detuning under deepest AGC control from the exact tuning center inspite of changing of the input capacity of the transistor.

Attention is now drawn to FIG. 2 wherein substantially the same elements have the same numerals as in FIG. 1 with the addition of the novel feature of the invention, namely, the insertion of condenser 8 having a value specifically calculated to meet the above basic purposes as indicated below.

Figure 3:
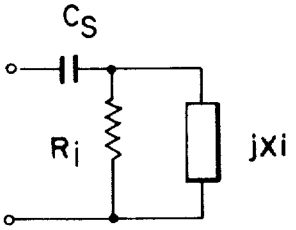
FIGS. 3, 4 and 5 are variations of equivalent circuit diagrams concerning the circuit of FIG. 2.
Figure 4:
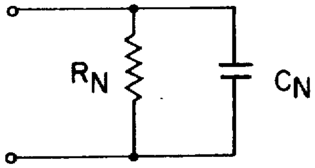

FIG. 3 shows an equivalent circuit of the input circuit of VHF transistor along A–A' line, wherein the input resistance of transistor 5 is shown as $R_i$ and input reactance is shown as $jX_i$, which equivalent circuit can be modified as per FIG. 4.

A comparison of both eqivalent circuits of FIGS. 3 and 4 produces the following equations:

$$R_N = \frac{1 + \left(\omega C_s - \frac{1}{X_i}\right)^2 R_i^2}{\omega^2 \cdot C_s^2 \cdot R_i} \qquad (10)$$

$$C_N = \frac{C_s \left[1 + \frac{1}{X_i}\left(\frac{1}{X_i} - \omega C_s\right) R_i^2\right]}{1 + \left(\omega C_s - \frac{1}{X_i}\right)^2 R_i^2} \qquad (11)$$

Define $R_{i_1}$ as the input resistance and $X_{i_1}$ as the input reactance both under the shallowest AGC, and $R_{i_2}$ as the input resistance and $X_{i_2}$ as the input resistance both under the deepest AGC. Then $$R_{N_1} = \frac{1 + \left(\omega C_s - \frac{1}{X_{i_1}}\right)^2 R_{i_1}^2}{\omega^2 \cdot C_s^2 R_{i_1}} \qquad (12)$$

-Continued $$R_{N_2} = \frac{1 + \left(\omega C_s - \frac{1}{X_{i_2}}\right)^2 R_{i_2}^2}{\omega^2 \cdot C_s^2 \cdot R_{i_2}} \qquad (13)$$

From purposes ( 1 )described above, the condition, $R_{N_2} > R_{N_1}$ should be considered. Therefore, the range of $C_s$ will be defined as follows:

$$C_s < \frac{\left(\frac{R_{i_1}}{X_{i_1}} - \frac{R_{i_2}}{X_{i_2}}\right)}{\omega (R_{i_1} - R_{i_2})} + \sqrt{\frac{1}{\omega^2 R_{i_1} \cdot R_{i_2}} + \frac{\left(\frac{1}{X_{i_1}} - \frac{1}{X_{i_2}}\right)^2 \cdot R_{i_1} \cdot R_{i_2}}{\omega^2 (R_{i_1} - R_{i_2})^2}} \qquad (14)$$

In the same way equation ( 11 ) becomes:

$$C_{N_1} = \frac{C_s \left\{1 + \frac{1}{X_{i_1}}\left(\frac{1}{X_{i_1}} - \omega C_s\right) R_{i_1}^2\right\}}{1 + (\omega C_s - \frac{1}{X_{i_1}})^2 R_{i_1}^2} \qquad (15)$$

$$C_{N_2} = \frac{C_s \left\{1 + \frac{1}{X_{i_2}}\left(\frac{1}{X_{i_2}} - \omega C_s\right) R_{i_2}^2\right\}}{1 + (\omega C_s - \frac{1}{X_{i_2}})^2 R_{i_2}^2} \qquad (16)$$

Letting $X_{i_1} = -1/\omega C_{i_1}$, $X_{i_2} = -1/\omega C_{i_2}$ and solving for $C_s$ under the condition $C_{N_1} = C_{N_2}$ for maintaining good tuning at any rate of AGC, and under the further condition of $$\omega^2 (C_{i_1} - C_{i_2}) R_{i_1}^2 \cdot R_{i_2}^2 >> R_{i_1}^2 - R_{i_2}^2 \; \omega^2 \cdot R_{i_1}^2 \cdot R_{i_2}^2 >> R_{i_1}^2 + R_{i_2}^2$$

then $$C_s \cong -C_{i_1}$$

or $$C_s \cong -C_{i_2} \qquad (17)$$

Figure 8:
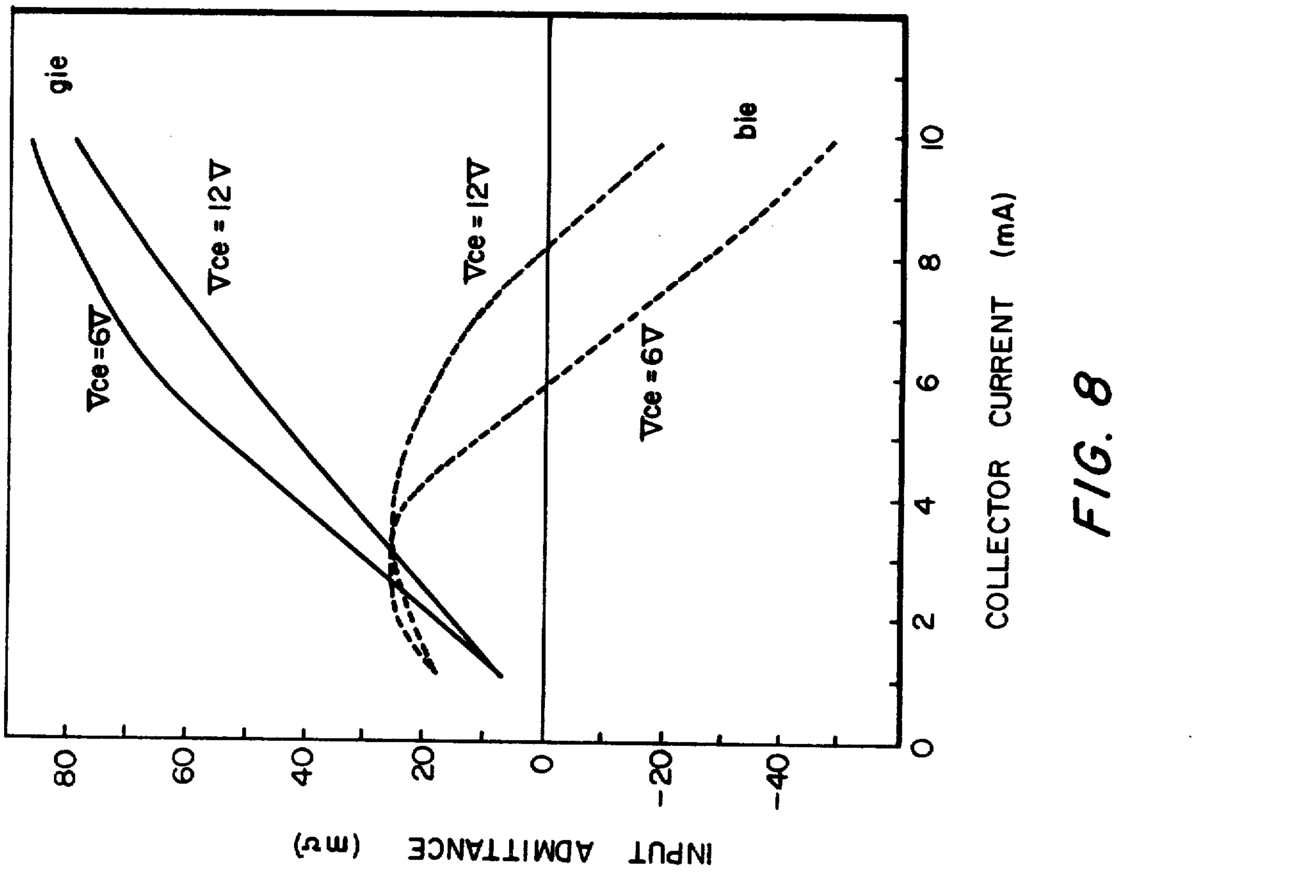
FIG. 8 depicts a chart covering general characteristics of a transistor used in VHF amplifiers in terms of "collecter current" versus "input admittance."

It is well known to the person who is skilled in the art that input conductance $g_{ie}$ and input susceptance $b_{ie}$ follow individually the curve as set forth in FIG. 8 in general. Considering the fact, it is clearly understood that $$C_s \cong -C_{i_2} \qquad (18)$$

then it is also clearly understood the amount of detuning can be minimized by adequate selection of the value $C_s$ of condenser 8 under the deep AGC condition.

Figure 5:
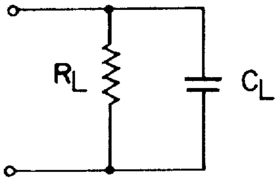

FIG. 5 shows an equivalent circuit of the circuit on a pair of terminals cut along line B–B' in FIG. 2.

Each value of resistance $R_i$, $R_N$ and $R_L$ and each resistance $X_i$, $C_N$ and $C_L$ in FIGS. 3, 4 and 5 follow the similar characteristic curve with the change of AGC voltage and satisfy the condition of, $$1 << \omega^2 (C_1 + C_2 + C_N)^2 \cdot R_N^2$$
$$1 << \omega^2 (C_2 + C_N)(C_1 + C_2 + C_N) R_N^2$$

if the capacity $C_s$ of said condenser 8 is adequately selected referring to the calculation above. That means the formation of the following equation.

$$R_L \cong \left(\frac{C_1 + C_2 + C_N}{C_1}\right)^2 - R_N$$
$$C_L \cong \left(\frac{C_1}{C_1 + C_2 + C_N}\right) (C_2 + C_N)$$

In brief, insertion of condenser 8 which capacity satisfies the equations above insures an increase in the resistance value $R_L$ and a minimization of shift width or detuning of the first tuning circuit which means also that a high quality factor is maintained under the deepest AGC control. The improved feature of the present invention is clearly observed in FIG. 6 as dotted curve B and in FIG. 7 as dotted curve E concerning to oscillation interference.

In addition, it should be noted that more than 10dB of improvement is observed in connection with the interference from the second term high harmonic distortion and it is improved more than 20dB on the bisignal interference, both compared with the prior art.

While one embodiment of the invention has been shown and described, other variations will be readily apparent to those skilled in the art. Therefore, the invention is not limited to these embodiments but is intended to cover all such variations as may be within the scope of the invention defined by the following claims.

What is claimed

1. In a solid state VHF input circuit for receiving a desired signal said input circuit having a tuning stage including a tuning coil connected to an antenna terminal and a pair of serially connected condensers connected across said tuning coil, and a transistor amplifier stage with AGC having its base coupled to the common terminal between said serially connected condensers to receive the output of said tuning stage, the improvement for eliminating interference problems comprising a third condenser means inserted between said common terminal and said base of said transistor, the capacitance of said third condenser means being selected to prevent reduction of the quality factor of said tuning stage in case of reception in the strong field of broadcast of said desired signal thereby eliminating interference problems caused by the nonlinear characteristics of said transistor.

2. In a solid state VHF input circuit for receiving a desired signal said input circuit having a tuning stage including a tuning coil connected to an antenna terminal and a pair of serially connected condensers connected across said tuning coil, and an amplifier stage with AGC including a bipolar transistor having the base thereof connected to the common terminal between said serially connected condensers to receive the output of said tuning stage, the improvement for eliminating interference problems comprising a third condenser means inserted between said common terminal and said base terminal of said transistor wherein the capacitance $C_s$ of said third condenser means is $$0 < C_s < \frac{\dfrac{R_{i_1}}{X_{i_1}} - \dfrac{R_{i_2}}{X_{i_2}}}{\omega (R_{i_1} - R_{i_2})} + \sqrt{\frac{1}{\omega^2 R_{i_1} \cdot R_{i_2}} + \frac{\left(\dfrac{1}{X_{i_1}} - \dfrac{1}{X_{i_2}}\right) R_{i_1} \cdot R_{i_2}}{\omega^2 (R_{i_1} - R_{i_2})}}$$

wherein $R_{i_1}$ is the input resistance of the transistor operating at maximum gain, $X_{i_1}$ is the input reactance of the transistor operating at maximum gain, $R_{i_2}$ is the input resistance of the transistor operating under the deepest AGC, $X_{i_2}$ is the input reactance of the transistor operating under the deepest AGC and $\omega = 2\pi f$ where $f$ is the frequency so as to prevent detuning under the deepest AGC and reduction of the quality factor of said tuning stage in case of reception in the strong field of broadcast of the desired signal thereby eliminating interference problems caused by the nonlinear characteristics of the transistor.

3. In a solid state VHF input circuit for receiving a desired signal said input circuit having a tuning stage including a tuning coil connected to an antenna terminal and a pair of serially connected condensers connected across said tuning coil, and an amplifier stage with AGC including a bipolar transistor having the base thereof connected to the common terminal between the serially connected condensers to receive the output of said tuning stage, the improvement for eliminating interference problems comprising a third condenser means inserted between said common terminal and said base terminal of said transistor the capacitance $C_s$ of said third condenser means being approximately the same as the value of the input capacity of the transistor operating under the control of the deepest AGC voltages so as to prevent detuning under the deepest AGC and reduction of the quality factor of said tuning stage when receiving the strongest field of broadcast of the desired signal thereby eliminating interference problems caused by the nonlinear characteristics of the transistor.

* * * * *